(12) United States Patent
Huang et al.

(10) Patent No.: US 11,908,829 B2
(45) Date of Patent: Feb. 20, 2024

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Yao-Te Huang, Hsinchu (TW); Hong-Wei Chan, Hsinchu (TW); Yung-Shih Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 47 days.

(21) Appl. No.: 17/350,856

(22) Filed: Jun. 17, 2021

(65) Prior Publication Data
US 2022/0310556 A1  Sep. 29, 2022

Related U.S. Application Data

(60) Provisional application No. 63/166,532, filed on Mar. 26, 2021.

(51) Int. Cl.
*H01L 23/00* (2006.01)
*H01L 23/528* (2006.01)

(52) U.S. Cl.
CPC .......... *H01L 24/83* (2013.01); *H01L 23/5283* (2013.01); *H01L 24/27* (2013.01); *H01L 24/32* (2013.01); *H01L 2224/2784* (2013.01); *H01L 2224/27452* (2013.01); *H01L 2224/32225* (2013.01); *H01L 2224/83005* (2013.01); *H01L 2224/83201* (2013.01); *H01L 2924/37001* (2013.01)

(58) Field of Classification Search
CPC ................. H01L 21/185; H01L 21/187; H01L 21/76251–76259; H01L 24/00–98; H01L 24/26–33; H01L 2224/00–98; H01L 2224/26–33519; H01L 2224/83894–83896; H01L 2224/80894–80896; H01L 2224/81894–81896; H01L 2224/82895–82897; H01L 21/768; H01L 21/76801; H01L 21/02274; H10N 30/072–073; H10K 71/50
See application file for complete search history.

(56) References Cited

U.S. PATENT DOCUMENTS

2019/0051524 A1\* 2/2019 Guo ....................... H01L 21/187

\* cited by examiner

*Primary Examiner* — Julio J Maldonado
*Assistant Examiner* — Stanetta D Isaac
(74) *Attorney, Agent, or Firm* — Slater Matsil, LLP

(57) ABSTRACT

In an embodiment, a method includes performing a first plasma deposition to form a buffer layer over a first side of a first integrated circuit device, the first integrated circuit device comprising a first substrate and a first interconnect structure; performing a second plasma deposition to form a first bonding layer over the buffer layer, wherein a plasma power applied during the second plasma deposition is greater than a plasma power applied during the first plasma deposition; planarizing the first bonding layer; forming a second bonding layer over a second substrate; pressing the second bonding layer onto the first bonding layer; and removing the first substrate.

20 Claims, 18 Drawing Sheets

INTEGRATED CIRCUIT PACKAGE AND METHOD OF FORMING SAME

PRIORITY CLAIM AND CROSS-REFERENCE

This application claims the benefits of U.S. Provisional Application No. 63/166,532, filed on Mar. 26, 2021, which application is hereby incorporated herein by reference in its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
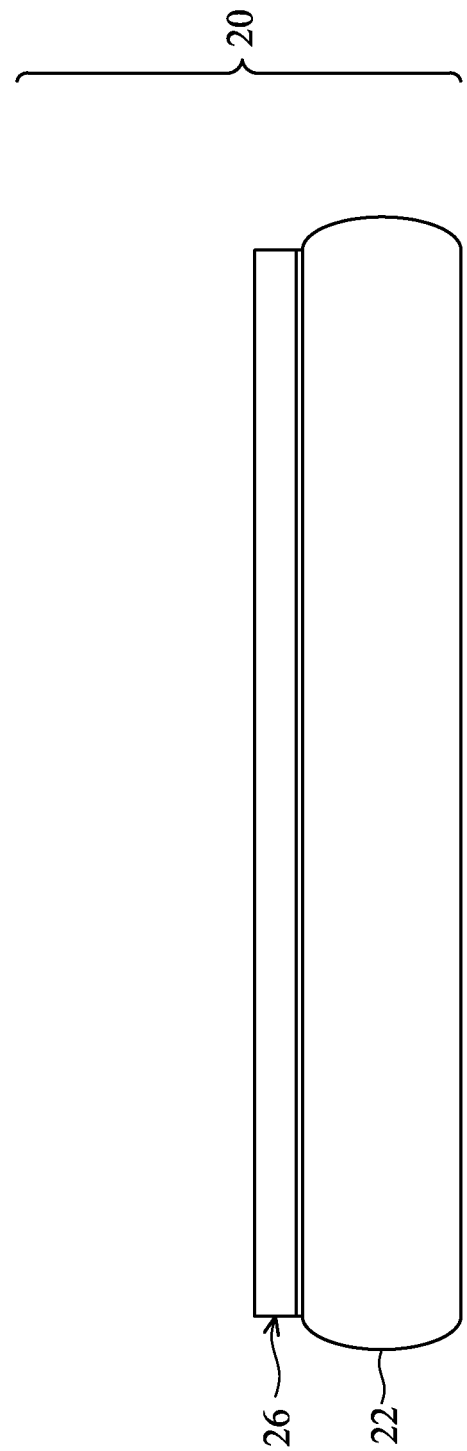
FIGS. 1 through 10 are cross-sectional views of intermediate steps during a process for forming integrated circuit packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages may be formed by directly bonding a carrier substrate or an integrated circuit device to a wafer that contains another device, such as an integrated circuit. The bonding may be a dielectric-to-dielectric bonding in which a first dielectric layer on the carrier substrate is pressed against a second dielectric layer on the wafer. The second dielectric layer may be a high density plasma oxide deposited using a high density plasma process, which can cause damage to underlying conductive features if the plasma reaches them. As such, a buffer layer is formed over the conductive features prior to forming the second dielectric layer. The buffer layer acts as a barrier to prevent plasma from reaching the conductive features. The yield and reliability of the integrated circuit packages may thus be improved.

FIG. 1 is a cross-sectional view of a first partial package 20 comprising a substrate 22 and a device layer 26 in an intermediate step in the formation of an integrated circuit package 100. Individual or multiple integrated circuit devices 100 may be packaged in subsequent processing to form integrated circuit packages.

The substrate 22 of the first partial package 20 may comprise a semiconductor substrate of silicon, doped or undoped, an active layer of a semiconductor-on-insulator (SOI) substrate, a multi-layered semiconductor substrate, or the like. The semiconductor substrate may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 22 has an active surface (e.g., the surface facing upward or the front-side surface) and an inactive surface (e.g., the surface facing downward or the back-side surface). Devices (also not separately illustrated) in a device layer 26 discussed below are at the active surface of the substrate 22. The devices may be active devices (e.g., transistors, diodes, etc.), capacitors, resistors, etc. The inactive surface may be free of devices.

The device layer 26 comprises devices formed over and in the substrate 22. For example, the device layer 26 may comprise active and passive devices such as transistors, capacitors, resistors, diodes, and the like, formed in and/or on the active surface of the substrate 22. As a result of the devices formed over and in the device layer 26, each integrated circuit package 100 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit devices 100 may be formed in a wafer, which may include different device regions that are singulated in subsequent steps to form a plurality of the integrated circuit devices 100. Although not specifically illustrated, contacts to the devices in the device layer 26 may be formed through topmost dielectric layers. For example, gate contacts may be formed to gate electrodes of transistors, and source/drain contacts may be formed to source/drain regions of the transistors.

Figure 2:
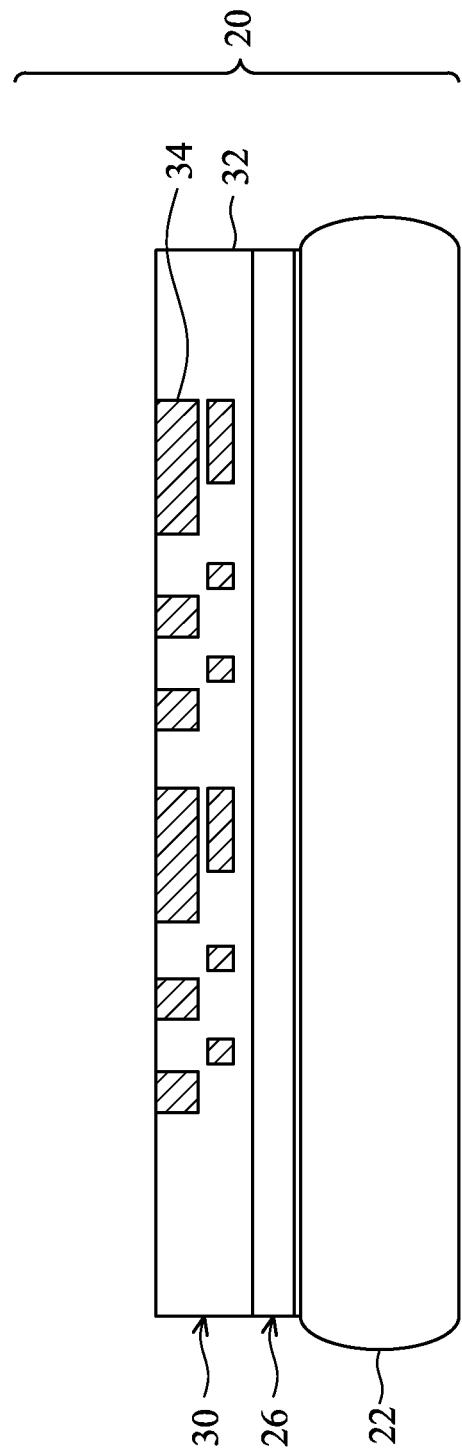

FIG. 2 is a cross-sectional view of a front-side interconnect structure 30 formed over the device layer 26 in an intermediate step in the formation of the integrated circuit package 100. The front-side interconnect structure 30 electrically connects the devices of the device layer 26 to form an integrated circuit. For example, the contacts discussed above (e.g., the gate contacts and the source/drain contacts) may couple the front-side interconnect structure 30 to the devices in the device layer 26. The front-side interconnect structure 30 may include one or more first dielectric layers 32 and one or more layers of first conductive features 34 forming respective metallization patterns in the first dielectric layers 32. Acceptable dielectric materials for the first dielectric layers 32 include a low-k dielectric material, an extra low-k (ELK) dielectric material, or the like. For example, the first dielectric layers 32 may comprise oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The first dielectric layers 32 may be deposited using an appropriate process, such as, CVD, ALD, PVD, PECVD, or the like. The first conductive features 34 of the metallization patterns may include conductive lines and conductive vias interconnecting the layers of conductive lines. For example, the conductive vias may extend through respective ones of the first dielectric layers 32 to provide vertical connections between layers of the conductive lines. The first conductive features 34 may be formed of a conductive material, such as a metal, such as copper, cobalt, aluminum, gold, combinations thereof, or the like. The front-side interconnect structure 30 may be formed by a damascene process, such as a single damascene process, a dual damascene process, combinations thereof, or the like.

In some embodiments, the first conductive features 34 may be formed using a damascene process in which a respective first dielectric layer 32 is patterned utilizing a combination of photolithography and etching techniques to form trenches corresponding to the desired pattern of the first conductive features 34. An optional diffusion barrier and/or optional adhesion layer may be deposited and the trenches may then be filled with a conductive material. Suitable materials for the barrier layer include titanium, titanium nitride, titanium oxide, tantalum, tantalum nitride, combinations thereof, or the like, and suitable materials for the conductive material include copper, silver, gold, tungsten, aluminum, combinations thereof, or the like. In an embodiment, the first conductive features 34 may be formed by depositing a seed layer of copper or a copper alloy, and filling the trenches by electroplating. A chemical mechanical planarization (CMP) process or the like may be used to remove excess conductive material from a surface of the respective first dielectric layer 32 and to planarize surfaces of the first dielectric layer 32 and the first conductive features 34 for subsequent processing.

While FIG. 2 illustrates about two layers of the first conductive features 34 in the front-side interconnect structure 30, it should be appreciated that the front-side interconnect structure 30 may comprise any number of layers of the first conductive features 34 disposed in any number of the first dielectric layers 32. As discussed above, the front-side interconnect structure 30 may be electrically connected to, for example, the gate contacts and the source/drain contacts to form functional integrated circuits. In some embodiments, the functional integrated circuits formed by the front-side interconnect structure 30 may comprise logic circuits, memory circuits, image sensor circuits, or the like. Although a top surface of the front-side interconnect structure 30 is illustrated as being substantially flat, the top surface of the front-side interconnect structure 30 may be nonplanar due to unevenness from a topmost layer of the first conductive features 34 formed in the first dielectric layers 32.

FIGS. 3 through 7 are cross-sectional views of intermediate steps during a process for bonding a carrier wafer 90 to the interconnect structure 30. As discussed below, the process includes forming a plurality of dielectric layers to protect conductive features of the interconnect structure 30 and facilitate a seamless bonding with the carrier wafer 90.

Figure 3:
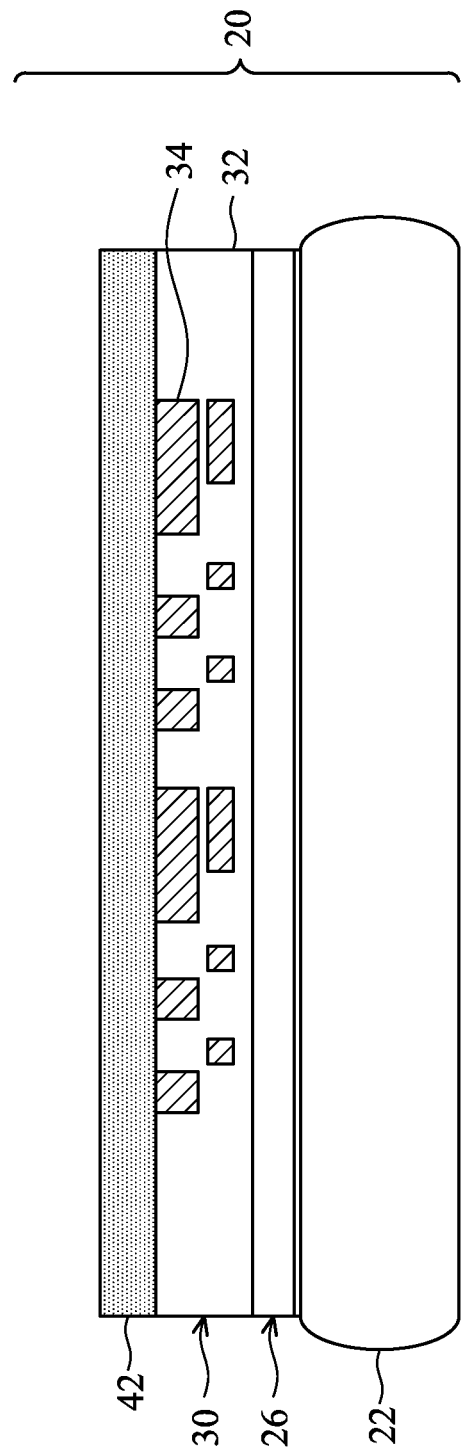

In FIG. 3, a buffer layer 42 is formed over the front-side interconnect structure 30 to protect the front-side interconnect structure 30 during subsequent processing steps, such as deposition of a first bonding layer 44 discussed in greater detail below. The buffer layer 42 may comprise a dielectric material, such as silicate glass, including undoped silicate glass (USG), an oxide, or the like. The buffer layer 42 may be deposited using a CVD process, such as high-density plasma CVD (HDP-CVD), or any suitable technique. For example, a silicon precursor (e.g., silane) may be flowed into a process chamber at a rate of between about 10 standard cubic centimeters per minute (sccm) and about 1000 sccm, and an oxygen precursor may be flowed at a rate of between about 10 sccm and about 1000 sccm. In addition, an inert gas, such as argon or nitrogen may also be flowed during formation of the buffer layer 42, for example, to help achieve and maintain the desired process conditions. The process chamber may be maintained at pressures between about 2 mTorr and about 100 mTorr. Formation of the buffer layer 42 may be performed at a low power, such as between about 100 Watts and about 2000 Watts. After deposition, the buffer layer 42 may have a density of between about 2 g/mL$^3$ and about 2.4 g/mL$^3$. The low power (e.g., in the above range) ensures that the plasma from this deposition does not cause damage to underlying conductive material, a phenomenon described in greater detail below.

Figure 4:
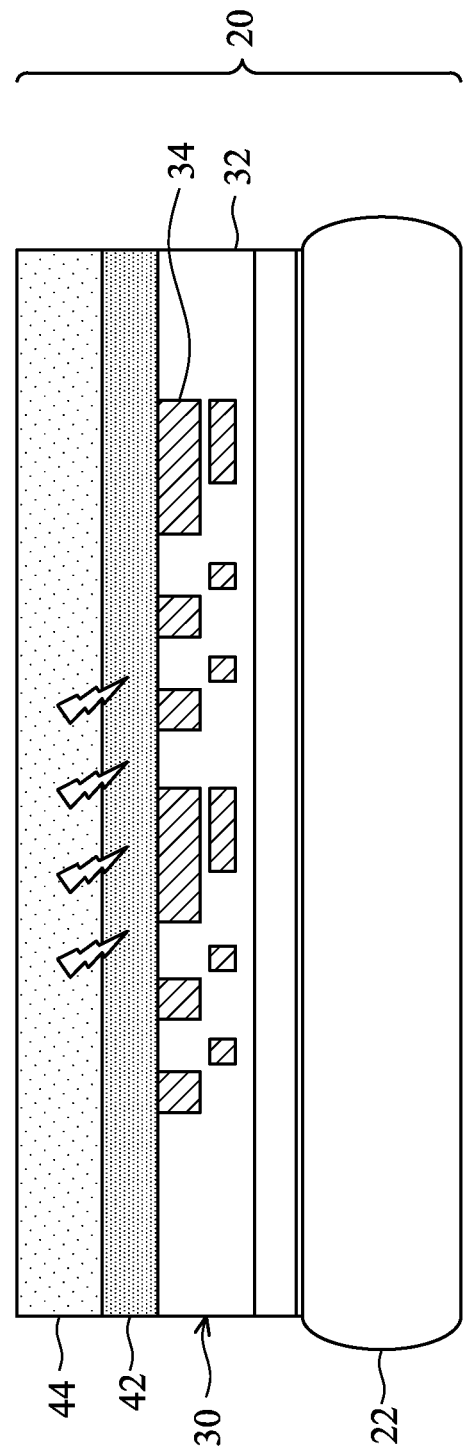

In FIG. 4, a first bonding layer 44 is formed over the buffer layer 42. The first bonding layer 44 may comprise a dielectric material, such as silicon oxide (SiO$_x$) wherein x is between about 1 and about 6. The first bonding layer 44 may be deposited using a CVD process, such as HDP-CVD, or any suitable technique. For example, a silicon precursor (e.g., silane) may be flowed into a process chamber (e.g., the same process chamber used to deposit the buffer layer 42) at a rate of between about 10 sccm and about 1000 sccm, and an oxygen precursor may be flowed at a rate of between about 10 sccm and about 1000 sccm. In addition, an inert gas, such as argon or nitrogen may also be flowed during formation of the first bonding layer 44, for example, to help achieve and maintain the desired process conditions. The process chamber may be maintained at pressures between about 2 mTorr and about 100 mTorr. Formation of the first bonding layer 44 may be performed at a high power, such as between about 1000 Watts and about 10000 Watts, which is higher than a power applied during the deposition of the buffer layer 42. The high power plasma process may decrease the frequency of defects in the deposited first bonding layer 44, and may further increase the density of the deposited first bonding layer 44 by forming tighter interconnections between the atoms. The high power process forms the first bonding layer 44 with a greater density than that of the buffer layer 42, such as a density of between about 2 $g/mL^3$ and about 2.5 $g/mL^3$. The high power process further provides the first bonding layer 44 with a robust durability that will have a smooth surface after planarization in a subsequent step described below, thereby improving bonding of the carrier wafer 90 to the first bonding layer 44.

The high power used for the deposition of the first bonding layer 44 causes high levels of plasma to impinge the structure. As a result, some of the plasma penetrates and is absorbed by at least a portion of the buffer layer 42. The plasma that penetrates the buffer layer 42 may cause the buffer layer 42 to increase in density to between about 2 $g/mL^3$ and about 2.5 $g/mL^3$. In some embodiments, the density of an upper portion of the buffer layer 42 increases due to the plasma, while the density of a lower portion of the buffer layer 42 remains substantially the same due to the plasma not reaching the lower portion. If the plasma were able to penetrate an entire thickness of the buffer layer 42, it could cause plasma induced damage (PID) to underlying conductive material, such as the first conductive features 34 of the front-side interconnect structure 30. For example, plasma that reaches upper levels of the conductive material can then travel downward through levels of the conductive material causing damage at various locations. In some cases, the PID could cause metal burnout during use of the completed integrated circuit device. For example, portions of the front-side interconnect structure 30 in which the first conductive features 34 are proximal to one other with a thin region of dielectric material from the first dielectric layers 32 therebetween may be susceptible to being damaged by the plasma (e.g., due to charge buildup) to the extent that those first conductive features may become shorted by the PID. In addition, portions of the underlying conductive material in which metal features having different compositions are in physical contact may also be susceptible to PID due to charge buildup, which could damage those metal features. For example, interfaces between the first conductive features 34 and the underlying contacts may experience PID from too much plasma reaching the front-side interconnect structure 30. However, presence of the buffer layer 42 prevents or reduces the amount of plasma that can reach the first conductive features 34 and therefore prevents the conductive features 34 from suffering PID during deposition of the first bonding layer 44.

The first buffer layer 42 and the first bonding layer 44 may be deposited to have a combined thickness of greater than about 2000 nm, such as between about 2000 nm and about 20000 nm. For example, the first buffer layer 42 may be deposited to have a thickness of greater than about 600 nm, such as between about 600 nm and about 17000 nm, and the first bonding layer 44 may be deposited to have a thickness of greater than about 1400 nm, such as between about 1400 nm and about 3000 nm. The thickness of the first bonding layer 44 being greater than about 600 nm and the combined thickness of both layers being greater than about 2000 nm ensure that a top surface of the first bonding layer 44 is substantially planar and compensates for the unevenness in the top surface of the front-side interconnect structure 30 discussed above. As a result of the planarity of the first bonding layer 44, subsequent steps of bonding the first bonding layer 44 with another layer may be performed without forming bubbles therebetween. Due to the high plasma power used to achieve that thickness of the first bonding layer 44, the thickness of the first bonding layer 44 being less than about 3000 nm and the thickness of the buffer layer 42 being greater than about 600 nm ensure that the underlying front-side interconnect structure 30 remains protected during formation of the first bonding layer 44. For example, the top surface of the first bonding layer 44 may have a roughness of between about 10 nm and about 50 nm. In addition, the thickness of the buffer layer 42 being greater than about 600 nm protects the first conductive features 34 from PID during deposition of the first bonding layer 44.

Figure 5:
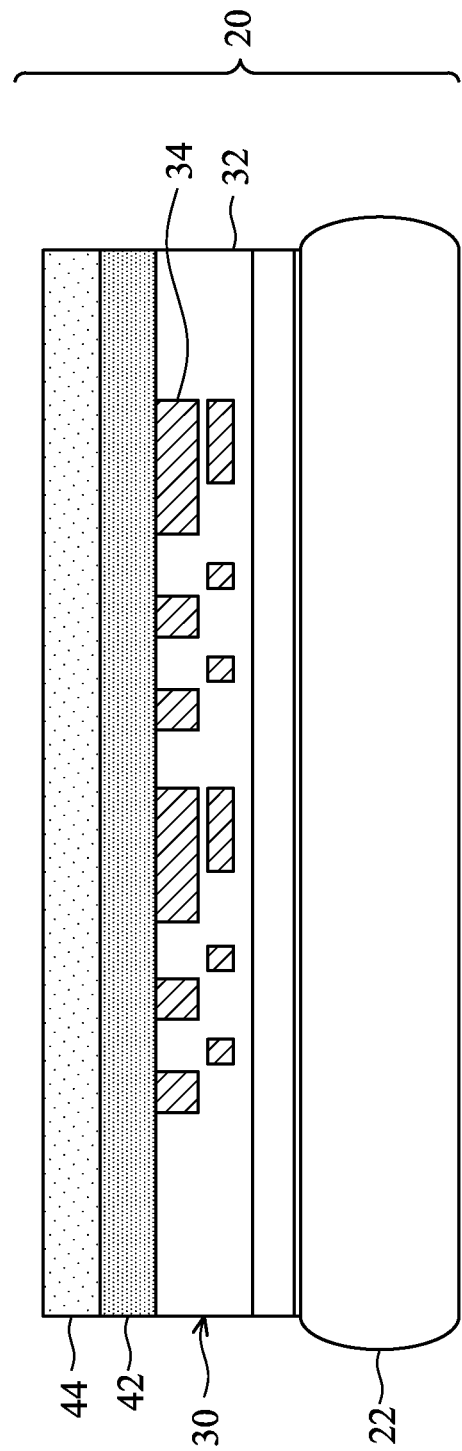

In FIG. 5, the first bonding layer 44 is thinned to further improve the planarity or flatness of a top surface of the first bonding layer 44. The thinning process may include a grinding process, a CMP, an etch-back, combinations thereof, or the like. After the thinning process, the first bonding layer 44 may have a thickness of greater than about 800 nm, such as between about 800 nm and about 2400 nm. For example, the thinning process may remove about 600 nm of the first bonding layer 44. In addition, a combined thickness of the first bonding layer 44 and the buffer layer 42 may be greater than about 1400 nm, such as between about 1400 nm and about 19400 nm. For example, after the thinning process, the top surface of the first bonding layer 44 may have a roughness of between about 10 nm and about 50 nm.

Figure 6:
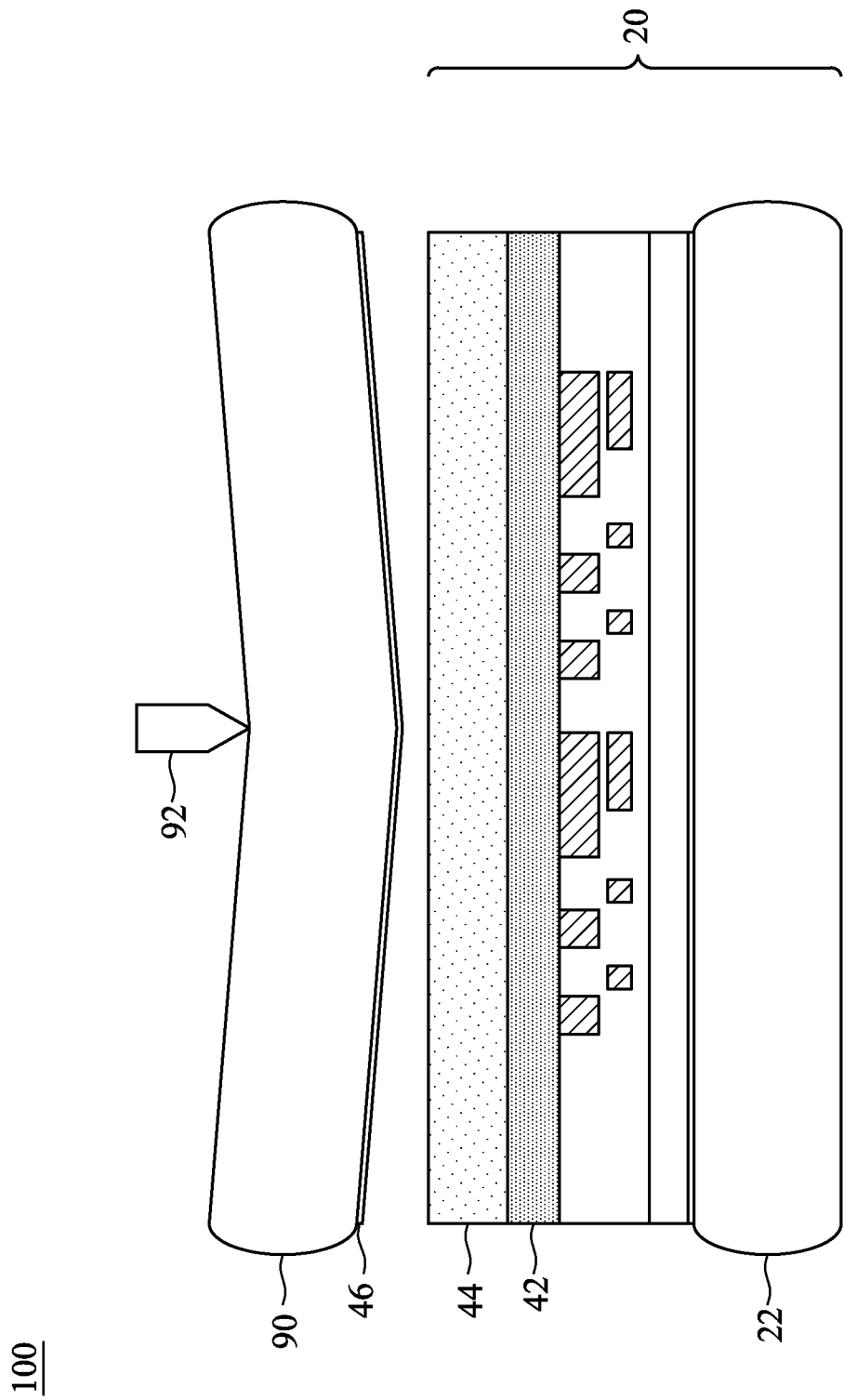

In FIG. 6, a carrier wafer 90 is bonded to the first partial package 20 over the top surface of the first bonding layer 44. The carrier wafer 90 may be a glass carrier substrate, a ceramic carrier substrate, a wafer (e.g., a silicon wafer), or the like. The carrier wafer 90 may provide structural support during subsequent processing steps and in the completed integrated circuit package 100. The low roughness (e.g., the high smoothness) of the top surface of the first bonding layer 44 ensures that the carrier wafer 90 bonds with the first partial package without forming bubbles between the first bonding layer 44 and the second bonding layer 46.

In accordance with some embodiments, the carrier wafer 90 may be bonded to the front-side interconnect structure 30 (e.g., to the first bonding layer 44) using a suitable technique, such as dielectric-to-dielectric bonding, or the like. The dielectric-to-dielectric bonding may comprise depositing a second bonding layer 46 over a surface of the carrier wafer 90 prior to the bonding. The second bonding layer 46 may comprise an oxide (e.g., silicon oxide or the like) that is deposited by CVD (e.g., HDP), ALD, PVD, thermal oxidation, or the like. Other suitable materials and processes may be used for the second bonding layer 46. The second bonding layer 46 may be deposited to have a thickness of between about 10 nm and about 150 nm.

The dielectric-to-dielectric bonding process may further include applying a surface treatment to one or more of the first bonding layer 44 and the second bonding layer 46. For example, the surface treatment may include a plasma treatment performed in a vacuum environment. After the plasma treatment, the surface treatment may further include a cleaning process (e.g., a rinse with deionized water or the like) that may be applied to one or more of the first bonding layer 44 and the second bonding layer 46. The carrier wafer 90 is then aligned with the front-side interconnect structure 30, and the two are pressed against each other to initiate a pre-bonding of the carrier wafer to the front-side interconnect structure 30. For example, a push pin 92 may extend through a carrier wafer chuck (not specifically illustrated) to warp or bend a center region of the carrier wafer 90. By warping the carrier wafer 90, physical contact is initially made near the center region of the carrier wafer 90 between the second bonding layer 46 and the first bonding layer 44 before allowing the second bonding layer 46 to physically contact and bond with the first bonding layer 44 at their respective edges. The carrier wafer chuck may then be moved further downward to bond a growing concentric circle of the second bonding layer 46 to the first bonding layer 44 until the edges meet and are bonded together. In some embodiments, the bonding process causes dangling bonds along the surface of the first bonding layer 44 to form chemical bonds with atoms or molecules along the surface of the second bonding layer 46, and/or vice versa. As a result, a bonded interface is formed between the first bonding layer 44 and the second bonding layer 46.

Figure 7:
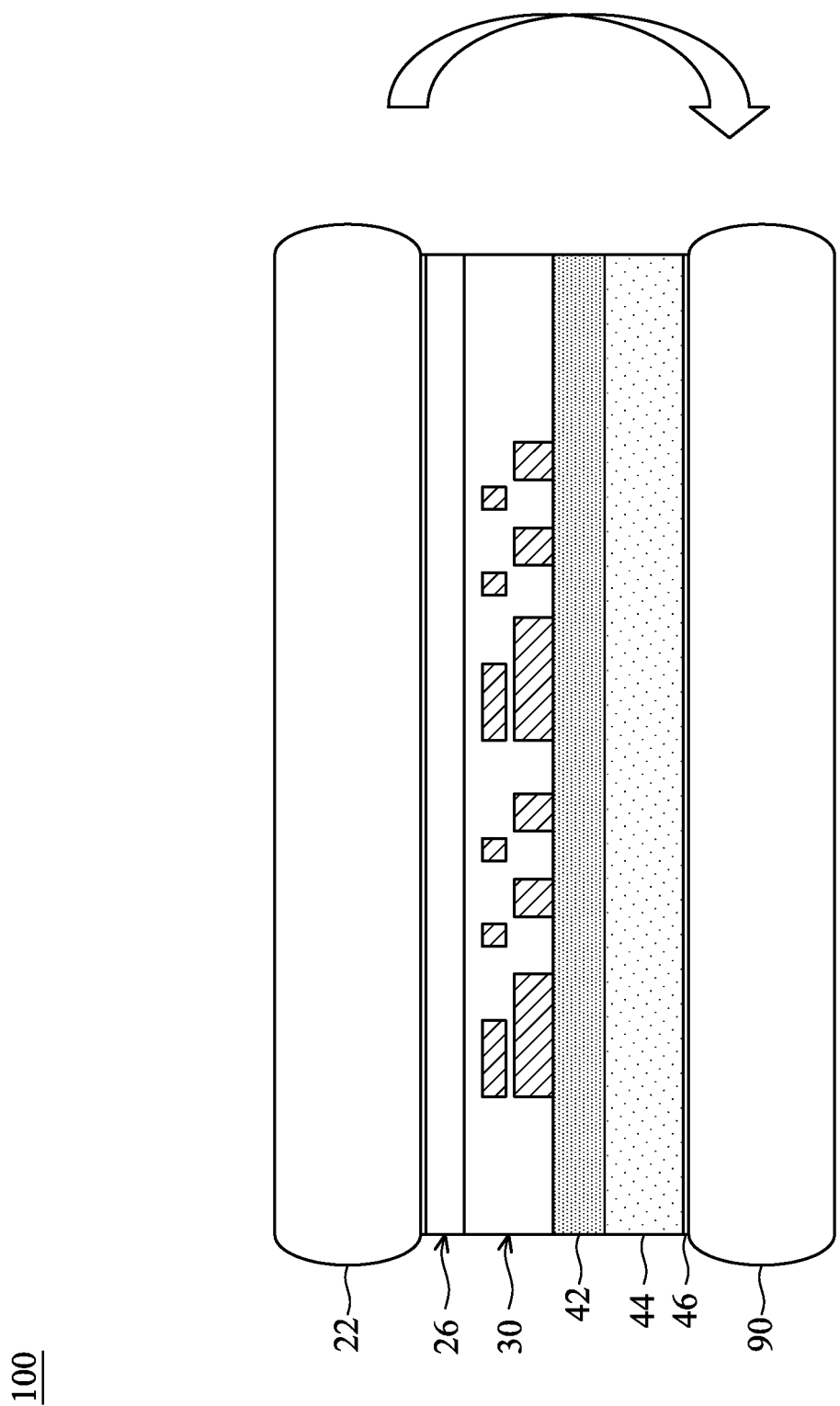

FIGS. 7 through 10 are cross-sectional views of intermediate steps during processes for removing the substrate 22 and forming additional circuitry and external connectors over a back-side of the device layer 26, as discussed in greater detail below. In FIG. 7, the intermediate structure is flipped over to prepare for the subsequent processing.

Figure 8:
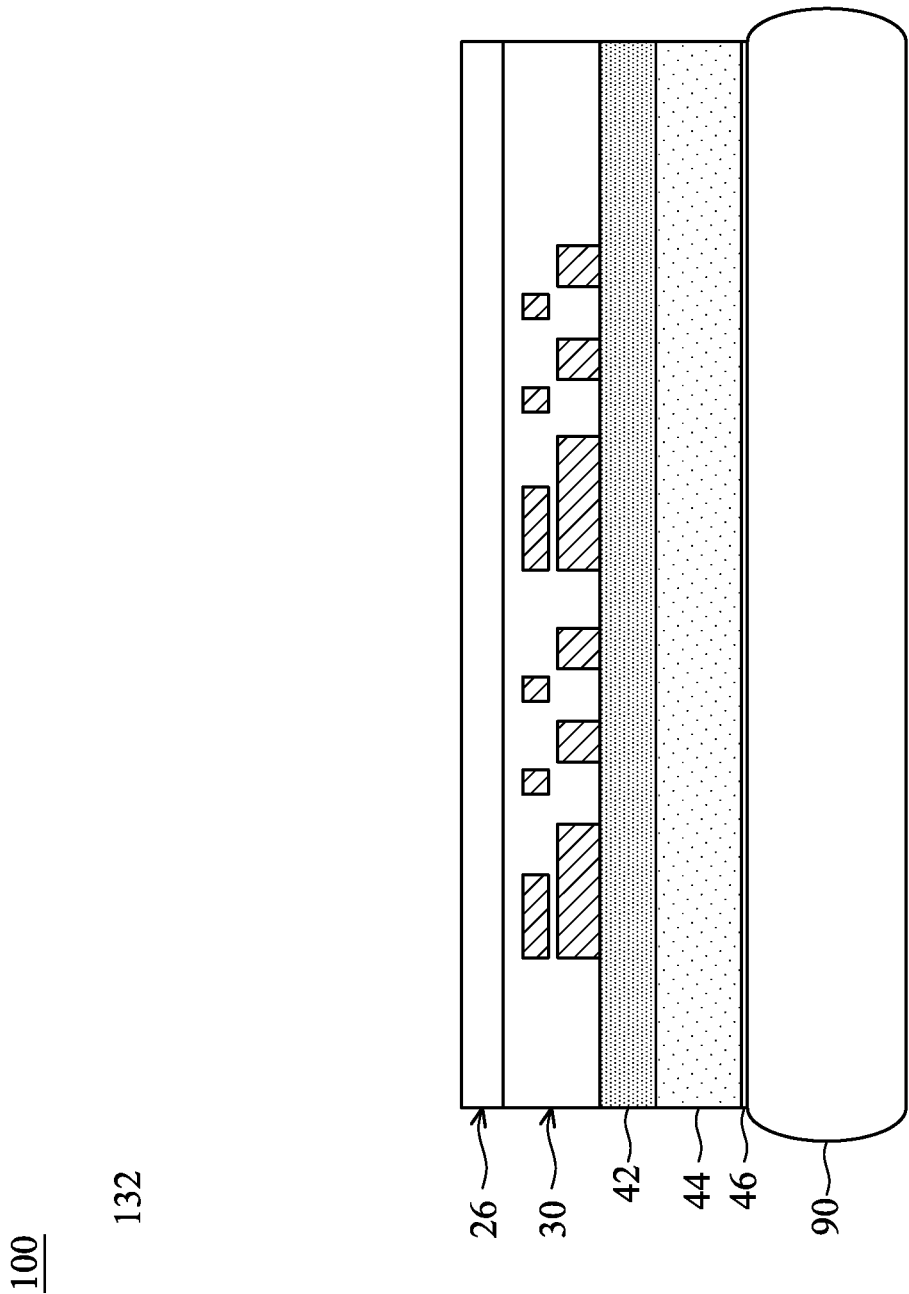

In FIG. 8, the substrate 22 is removed to expose portions of the devices in the device layer 26. For example, the substrate 22 may be removed using one or more processes, such as a thinning process, including a grinding process, a CMP, an etch-back, combinations thereof, or the like. In some embodiments, a grinding process or CMP is performed to remove a majority of the substrate 22 and then followed by a suitable etch-back process to remove either a remainder of the substrate 22 or to form openings (not specifically illustrated) in the substrate 22 to expose certain portions of the devices in the device layer 26. For example, back-side vias (not specifically illustrated) may be formed over the device layer 26 (e.g., in the openings) to be electrically connected to, for example, the source/drain regions of transistors in the device layer 26.

Figure 9:
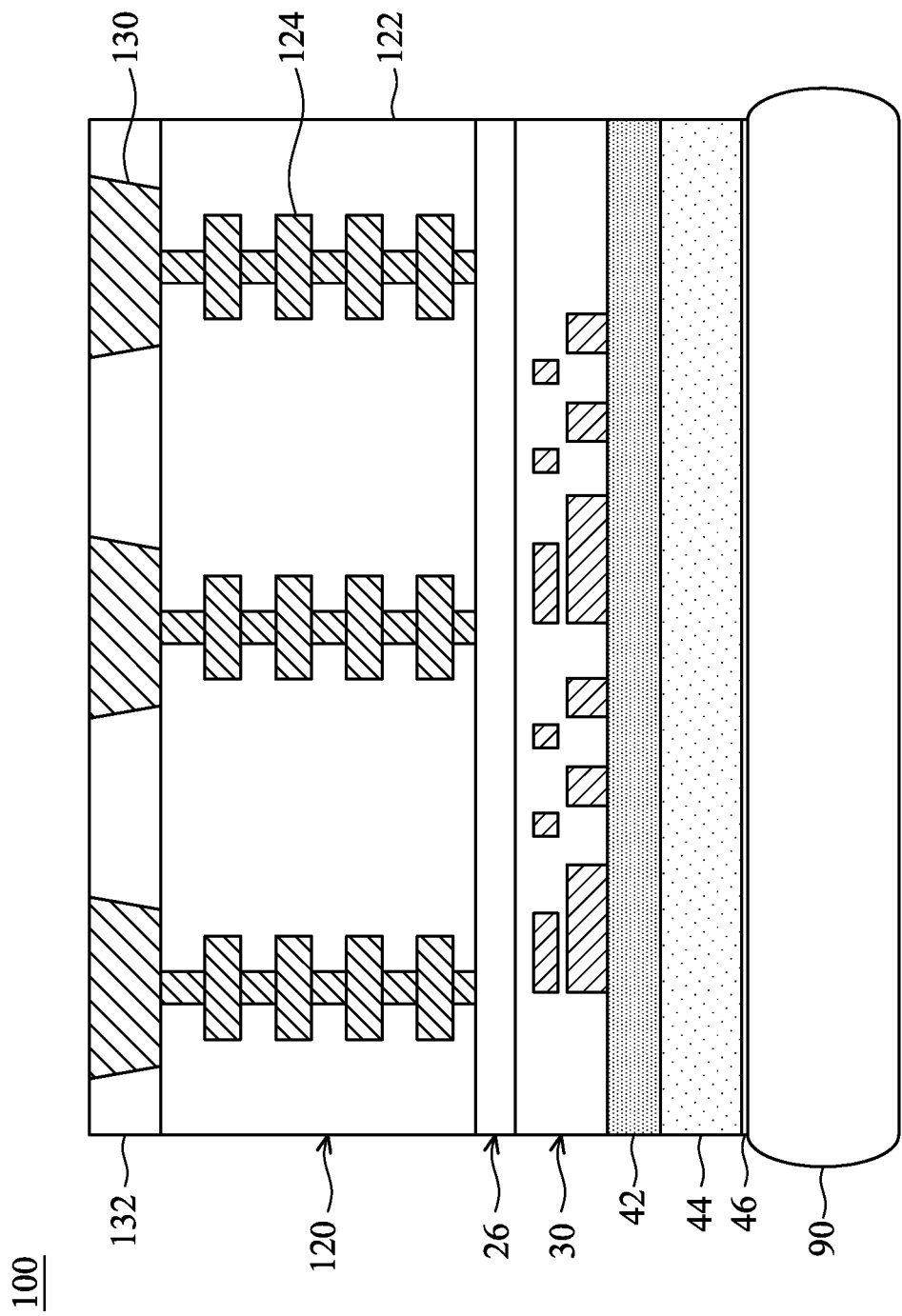

In FIG. 9, a back-side interconnect structure 120 and under bump metallurgies (UBMs) 130 are formed over a back-side of the device layer 26 and over the back-side vias (if present) disposed over the back-side of the device layer 26. The back-side interconnect structure 120 may be referred to as a back-side interconnect structure because it is formed on a back-side of the devices (e.g., transistor structures) in the device layer 26. The back-side vias are electrically interposed between the devices in the device layer 26 and the back-side interconnect structure 120. The back-side interconnect structure 120 may be formed with similar materials and similar processes as described above in connection with the front-side interconnect structure 30.

The back-side interconnect structure 120 may comprise one or more layers of second conductive features 124 formed in one or more stacked second dielectric layers 122. Each of the stacked second dielectric layers 122 may comprise a dielectric material, such as a low-k dielectric material, an extra low-k (ELK) dielectric material, or the like. The second dielectric layers 122 may be deposited using an appropriate process, such as, CVD, ALD, PVD, PECVD, or the like.

The second conductive features 124 of the back-side interconnect structure 120 comprise conductive lines and conductive vias that interconnect neighboring layers of the conductive lines. The conductive vias may extend through respective ones of the second dielectric layers 122 to provide vertical connections between the layers of the conductive lines. For example, the conductive vias may couple some of the conductive lines to others of the conductive lines. The second conductive features 124 and the second dielectric layers 122 may be formed using similar processes and similar materials as described above in connection with the first conductive features 34 and the first dielectric layers 32 of the front-side interconnect structure 30, including single and/or dual damascene processes, through any acceptable process, or the like.

Although FIG. 9 illustrates about four layers of the conductive lines of the second conductive features 124 in the back-side interconnect structure 120, it should be appreciated that the back-side interconnect structure 120 may comprise any number of layers of the second conductive features 124 disposed in any number of second dielectric layers 122. The back-side interconnect structure 120 may be electrically connected to the backside vias to form functional circuits. In some embodiments, the functional circuits formed by the back-side interconnect structure 120 in conjunction with the front-side interconnect structure 30 may comprise logic circuits, memory circuits, image sensor circuits, or the like.

FIG. 9 further illustrates UBMs 130 formed on a top surface of the back-side interconnect structure 120 (e.g., the second conductive features 124 and the second dielectric layers 122) and embedded in a third dielectric layer 132. As an example to form the UBMs 130, a seed layer (not illustrated) is formed over the exposed surfaces of the second conductive features 124 and the second dielectric layers 122. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 130. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 130. The third dielectric layer 132 may then be formed over the back-side interconnect structure 120 and around the UBMs 130.

Figure 10:
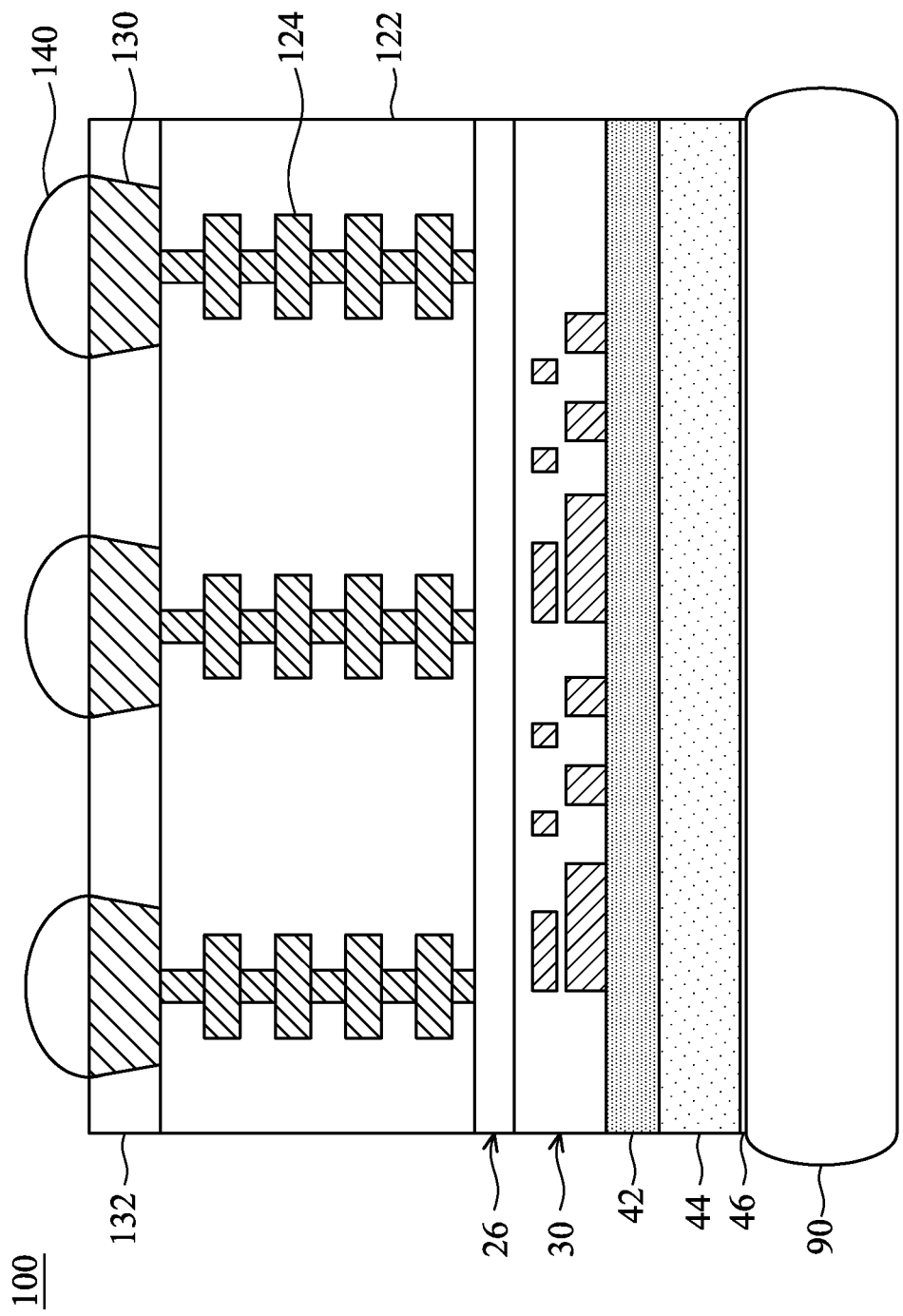

In FIG. 10, conductive connectors 140 are formed on the UBMs 130. The conductive connectors 140 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 140 may include a conductive material such as solder, copper, aluminum, gold, nickel, silver, palladium, tin, the like, or a combination thereof. In some embodiments, the conductive connectors 140 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 140 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Although not specifically illustrated, in some embodiments, a singulation process may be performed on the integrated circuit package 100 by cutting along scribe line regions, e.g., between package regions of the carrier wafer 90. The singulation process may include sawing, dicing, or the like. For example, the singulation process can include sawing the third dielectric layer 132, the back-side interconnect structure 120, the device layer 26, the front-side interconnect structure 30, the buffer layer 42, the first bonding layer 44, the second bonding layer 46, and the carrier wafer 90. The singulated integrated circuit devices 100 may then be attached and utilized with other packages.

Figure 11:
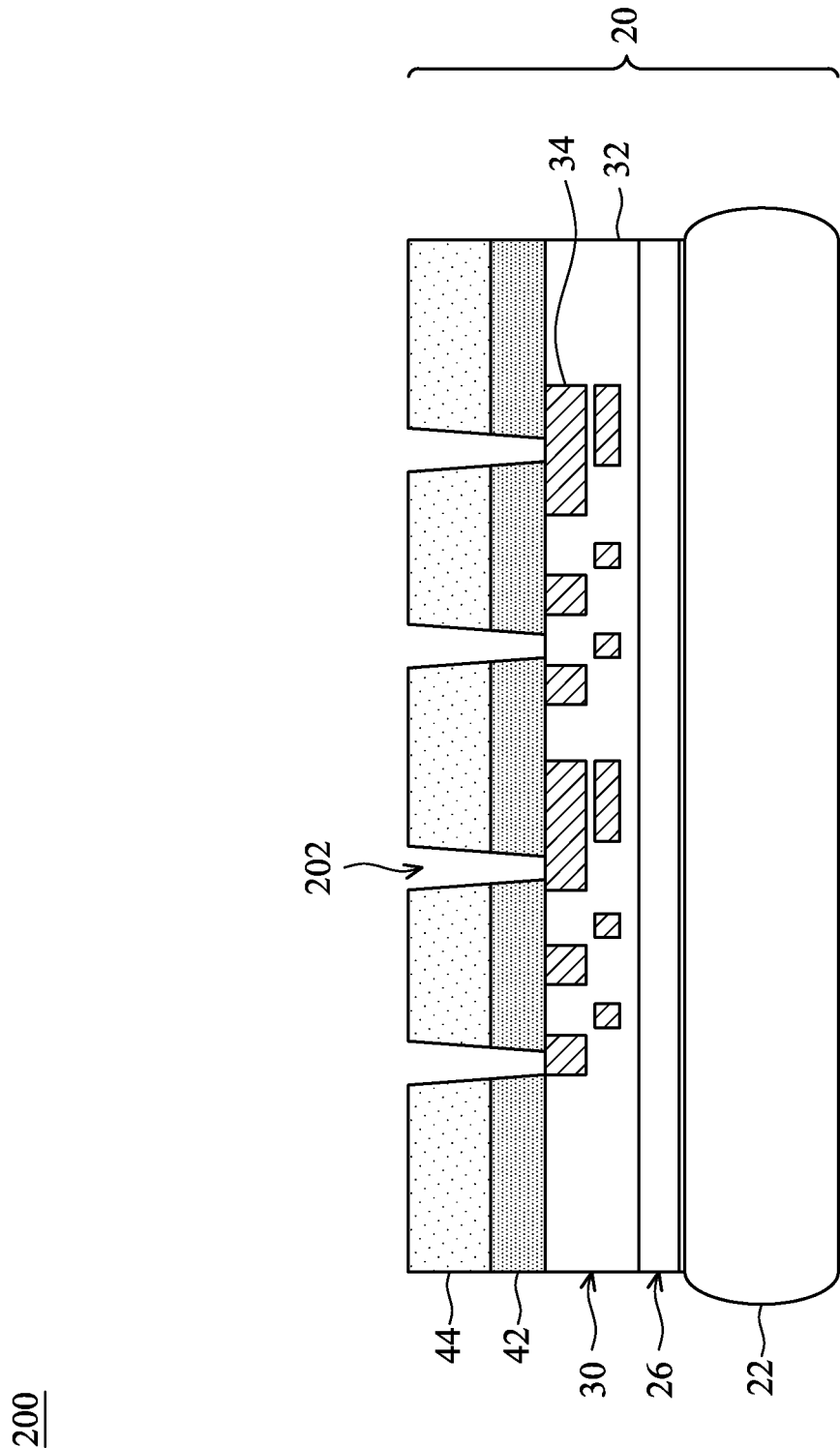
FIGS. 11 through 13 are cross-sectional views of intermediate steps during a process for forming integrated circuit packages, in accordance with some embodiments.
Figure 12:
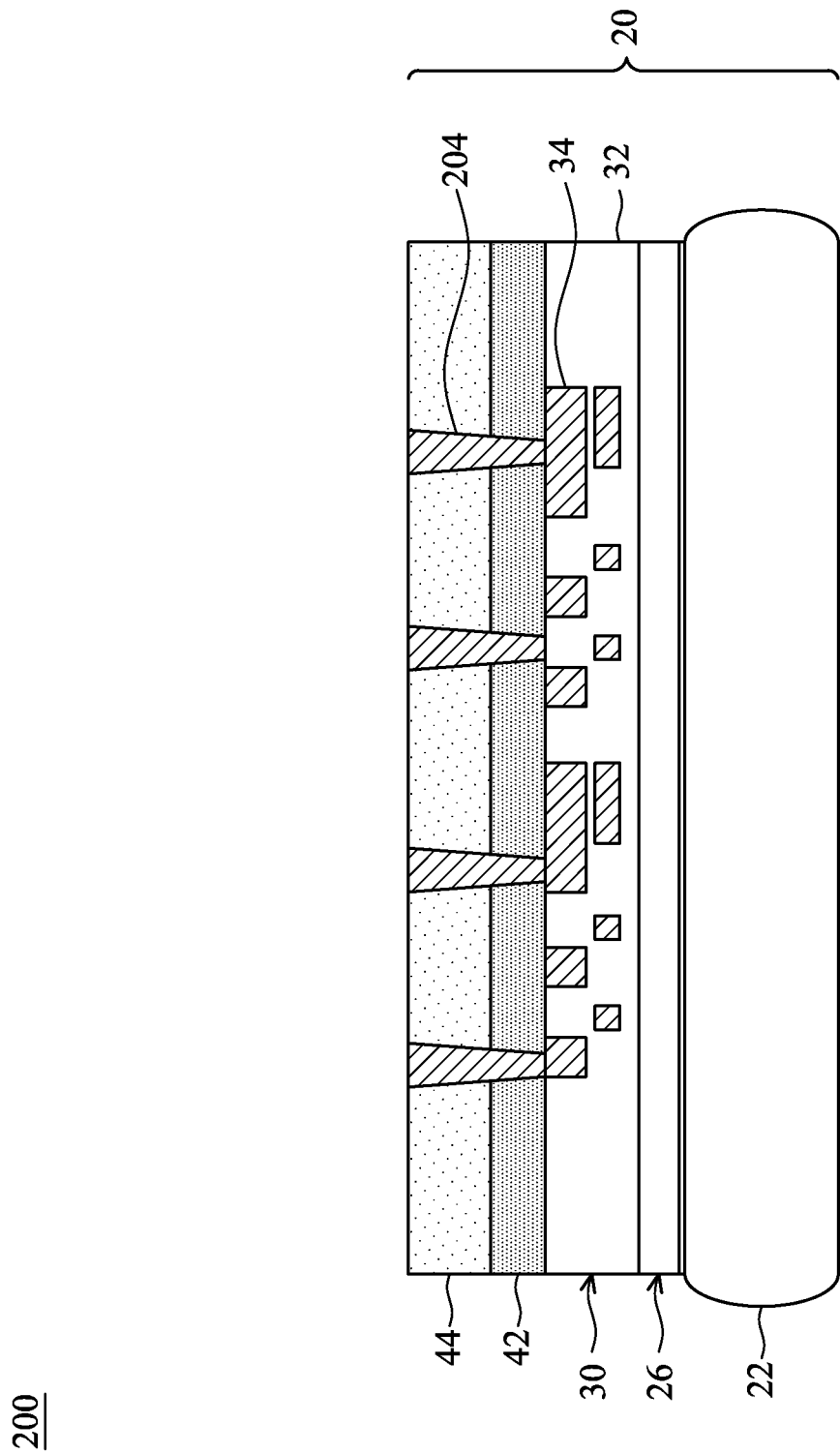
Figure 13:
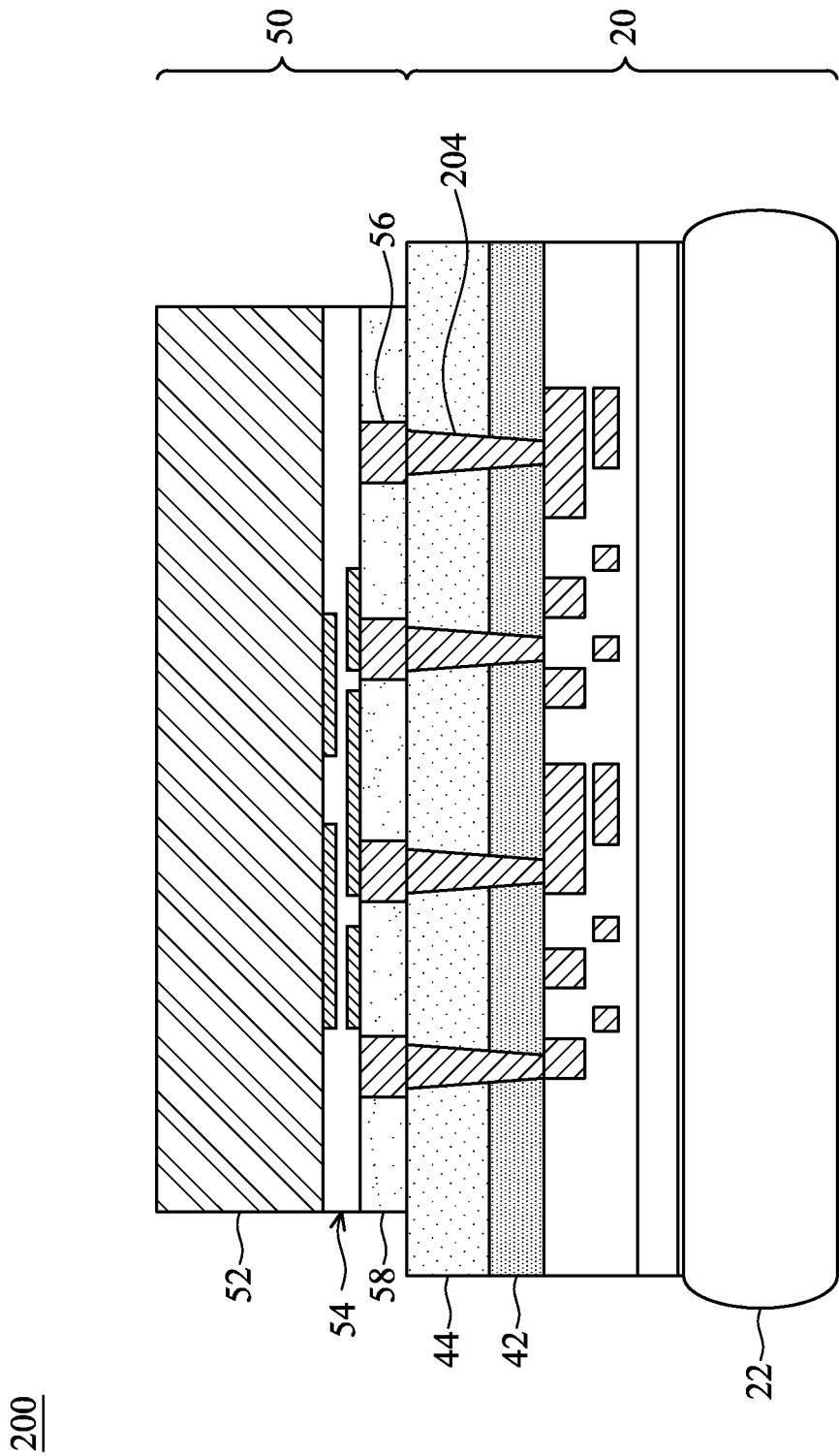
Figure 14:
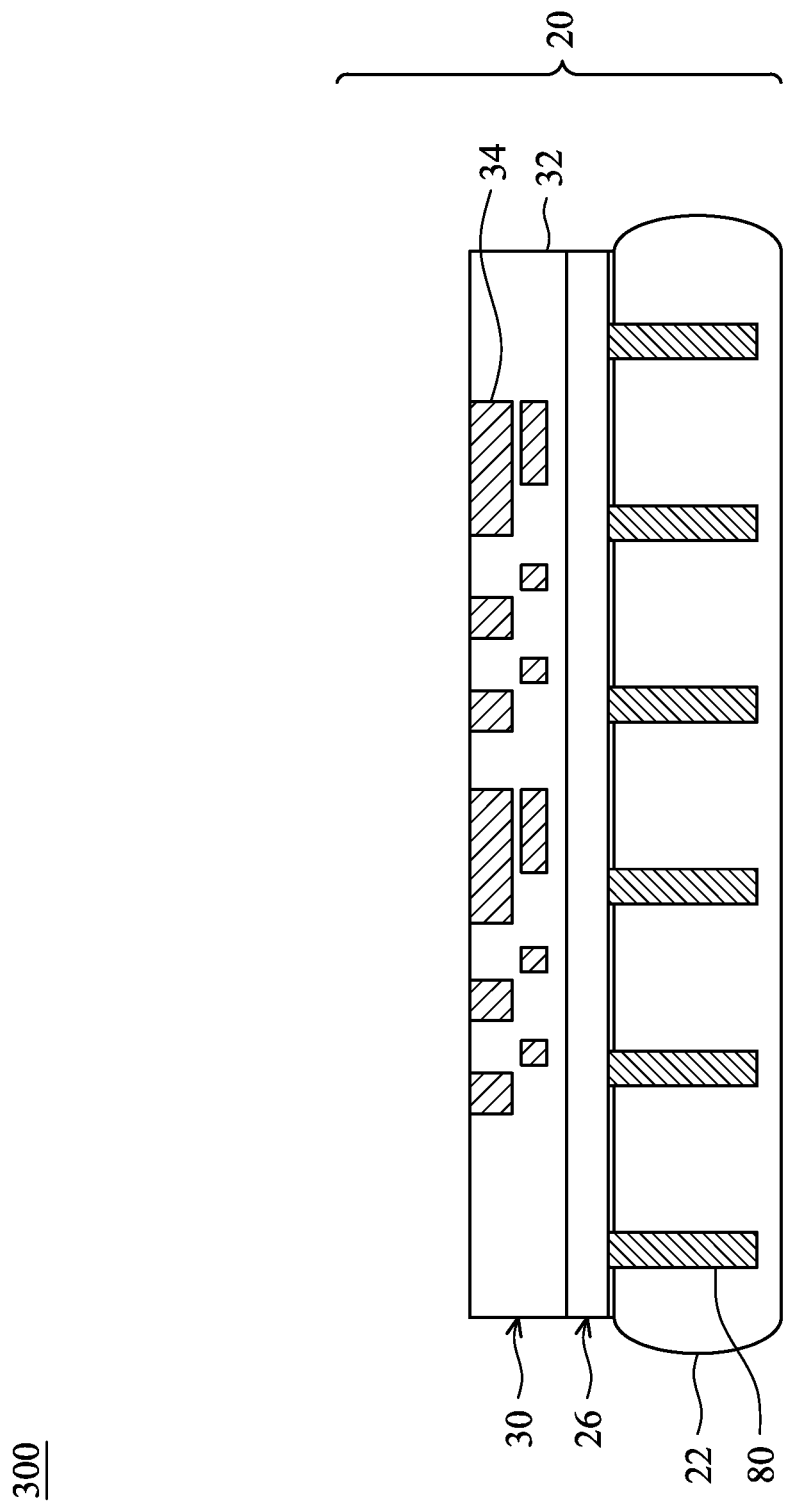
FIGS. 14 through 18 are cross-sectional views of intermediate steps during a process for forming integrated circuit packages, in accordance with some embodiments.

FIGS. 11 through 13 are cross-sectional views of intermediate steps during a process in the formation of an integrated circuit package 200, in accordance with some embodiments. For example, the integrated circuit package 200 is formed by bonding integrated circuit device 50 to the wafer 20 (including intermediate structure), for example, provided in FIG. 4 or 5 after forming the buffer layer 42 (e.g., using a low power plasma process) and the first bonding layer 44 (e.g., using a high power plasma process). In an embodiment, the integrated circuit packages 200 are chip-on-wafer (CoW) packages, although it should be appreciated that embodiments may be applied to other three-dimensional integrated circuit (3DIC) packages. In FIG. 11, recesses 202 are formed through the first bonding layer 44 and through the buffer layer 42 to expose some or all of the first conductive features 34 of the front-side interconnect structure 30.

In FIG. 12, third conductive features 204 are formed in the recesses 202. The third conductive features 204 are each electrically connected to a respective underlying first conductive feature 34. The third conductive features 204 may therefore be electrically connected to devices in the device layer 26 through the front-side interconnect structure 30. The third conductive features 204 may each comprise one or more layers, such as barrier layers, diffusion layers, and conductive fill materials. For example, in some embodiments, the third conductive features 204 each include a barrier layer and a conductive fill material. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the first bonding layer 44. Following the planarization, the third conductive features 204 and the first bonding layer 44 are level. In addition, the first bonding layer 44 may have a thickness of greater than about 800 nm, such as between about 800 nm and about 2400 nm, and a combined thickness of the buffer layer 42 and the first bonding layer 44 may be greater than about 1400 nm, such as between about 1400 nm and about 19400 nm.

In FIG. 13, an integrated circuit die 50 is bonded to the wafer 20. The integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The wafer 20 (or substrate 22) on which the integrated circuit packages 200 are formed may include different device regions that are singulated in previous or subsequent steps to form a plurality of the integrated circuit packages 200. The integrated circuit die 50 includes a semiconductor substrate 52, an interconnect structure 54, die connectors 56, and a dielectric layer 58. The dielectric layer 58 may be an oxide, such as silicon oxide.

The integrated circuit die 50 and the wafer 20 are directly bonded in a face-to-face manner by hybrid bonding, such a front-side surface of the integrated circuit die 50 (e.g., the die connectors 56 and the dielectric layer 58) is bonded to the wafer 20 (e.g., the third conductive features 204 and the second bonding layer 44). Specifically, the dielectric layer 58 of the integrated circuit die 50 is bonded to the first bonding layer 44 of the wafer 20 through dielectric-to-dielectric bonding, without using any adhesive material (e.g., die attach film). Similarly, the die connectors 56 of the integrated circuit die 50 are bonded to the third conductive features 204 of the wafer 20 through metal-to-metal bonding, without using any eutectic material (e.g., solder). The bonding may include a pre-bonding and an annealing. During the pre-bonding, a small pressing force is applied to press the integrated circuit die 50 against the wafer 20. The pre-bonding is performed at a low temperature, such as room temperature, such as a temperature in the range of about 15° C. to about 30° C., and after the pre-bonding, the dielectric layer 58 and the first bonding layer 44 are bonded to each other. The bonding strength is then improved in a subsequent annealing step, in which the dielectric layer 58 and the first bonding layer 44 are annealed at a high temperature, such as a temperature in the range of about 100° C. to about 450° C. After the annealing, bonds, such as fusions bonds, are formed bonding the dielectric layer 58 with the first bonding layer 44. For example, the bonds can be covalent bonds between the material of the dielectric layer 58 and the material of the first bonding layer 44. The die connectors 56 and the third conductive features 204 are connected to each other with a one-to-one correspondence. The die connectors 56 and the third conductive features 204 may be in physical contact after the pre-bonding, or may expand to be brought into physical contact during the annealing. Further, during the annealing, the material of the die connectors 56 and the third conductive features 204 (e.g., copper) intermingles, so that metal-to-metal bonds are also formed. Hence, the resulting bonds between the integrated circuit die 50 and the wafer 20 are hybrid bonds that include both dielectric-to-dielectric bonds and metal-to-metal bonds.

Although not specifically illustrated, the integrated circuit package 200 may be an intermediate structure that is then flipped over to prepare for processing of the back-side of the substrate 22 and/or the back-side of the device layer 26. For example, in some embodiments, the intermediate structure may be singulated into multiple integrated circuit packages 200 and undergo similar processing as described above in connection with FIGS. 7 through 10. For example, the intermediate structure may be placed on or attached to a carrier substrate or other suitable support structure for the subsequent processing steps. The carrier substrate may be attached to the substrate 52 of the integrated circuit die 50 with a release layer. The release layer may be formed of a polymer-based material, which may be removed along with the carrier substrate from the structure after processing. In some embodiments, the carrier substrate is a substrate such as a bulk semiconductor or a glass substrate. In some embodiments, the release layer is an epoxy-based thermal-release material, which loses its adhesive property when heated, such as a light-to-heat-conversion (LTHC) release coating.

FIGS. 14 through 18 are cross-sectional views of intermediate steps during a process for forming an integrated circuit package 300, in accordance with some embodiments. For example, the device layer 26 and the front-side interconnect structure 30 may be formed over the substrate 22, and then the buffer layer 42 and the first bonding layer 44 may be formed over the front-side interconnect structure 30 in order to attach the carrier wafer 90, similarly as described above. In addition, conductive vias 80 may extend through the substrate 22. Although not specifically illustrated, some or all of the conductive vias 80 may extend to and/or through the device layer 26 and to the first conductive features 34 of the front-side interconnect structure 30. The conductive vias 80 may therefore be electrically connected to portions of the front-side interconnect structure 30 and to devices in the device layer 26. The conductive vias 80 may also sometimes be referred to as through silicon vias (TSVs).

As an example to form the conductive vias 80, recesses can be formed in the substrate 22 and/or the front-side interconnect structure 30 by, for example, etching, milling, laser techniques, a combination thereof, and/or the like. In some embodiments, the conductive vias 80 are formed through the substrate 22 before formation of the front-side interconnect structure 30. In other embodiments, the conductive vias 80 are formed through the substrate 22 and the front-side interconnect structure 30 after formation of the front-side interconnect structure 30. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the front-side interconnect structure 30 or the substrate 22 by, for example, a CMP. Remaining portions of the barrier layer and conductive material form the conductive vias 80.

Figure 15:
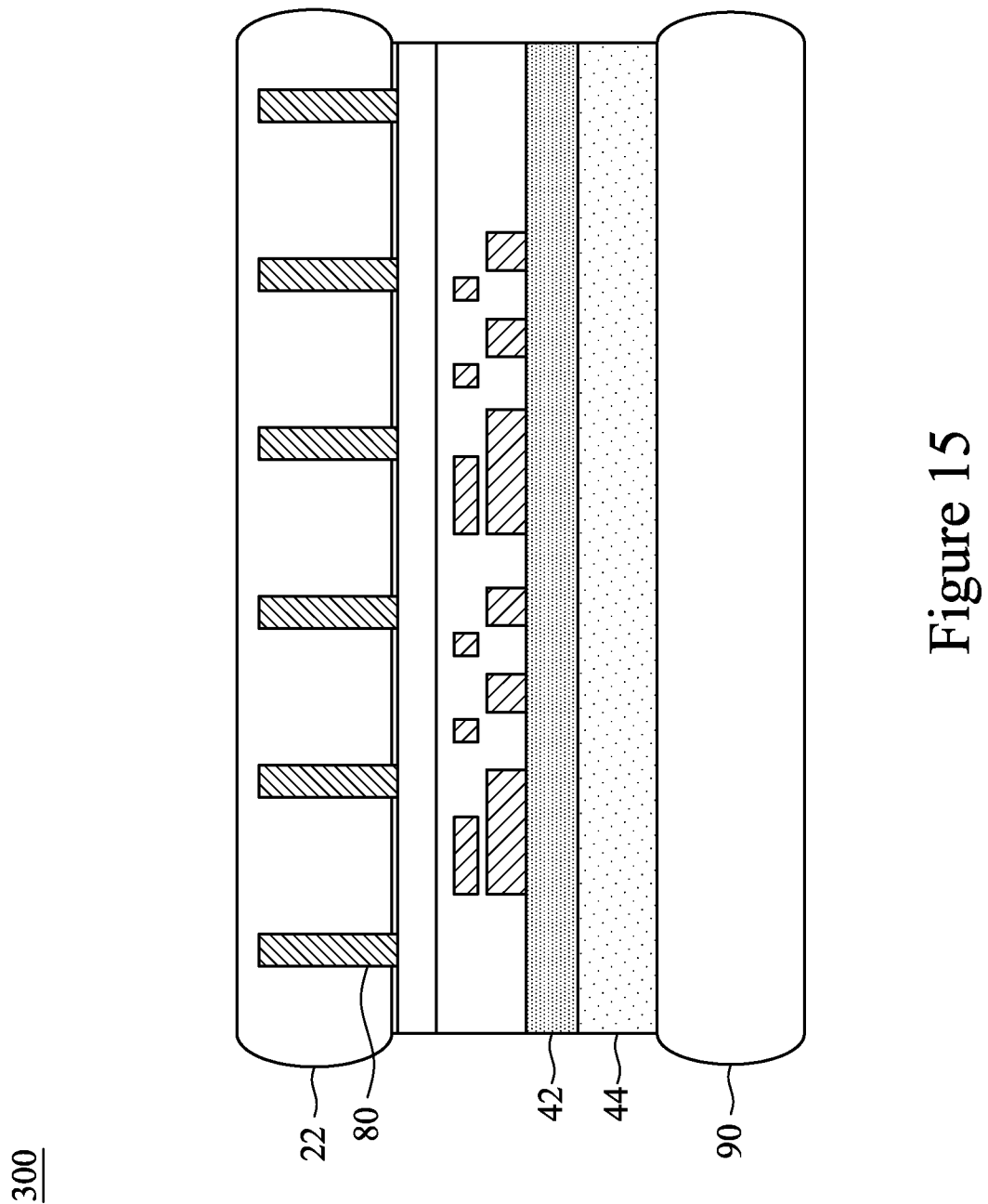

In FIG. 15, additional processing steps as those described above in connection with FIGS. 3 through 7 may be performed on the intermediate structure of the integrated circuit package 300. For example, as discussed with FIGS. 3 through 5, the buffer layer 42 and the first bonding layer 44 may be formed over the front-side interconnect structure 30. In addition, as discussed with FIGS. 6 through 7, the second bonding layer 46 may be formed over the carrier wafer 90, and the carrier wafer 90 may be bonded to the wafer 20. Further, the intermediate structure may be flipped in order to perform further processing.

Figure 16:
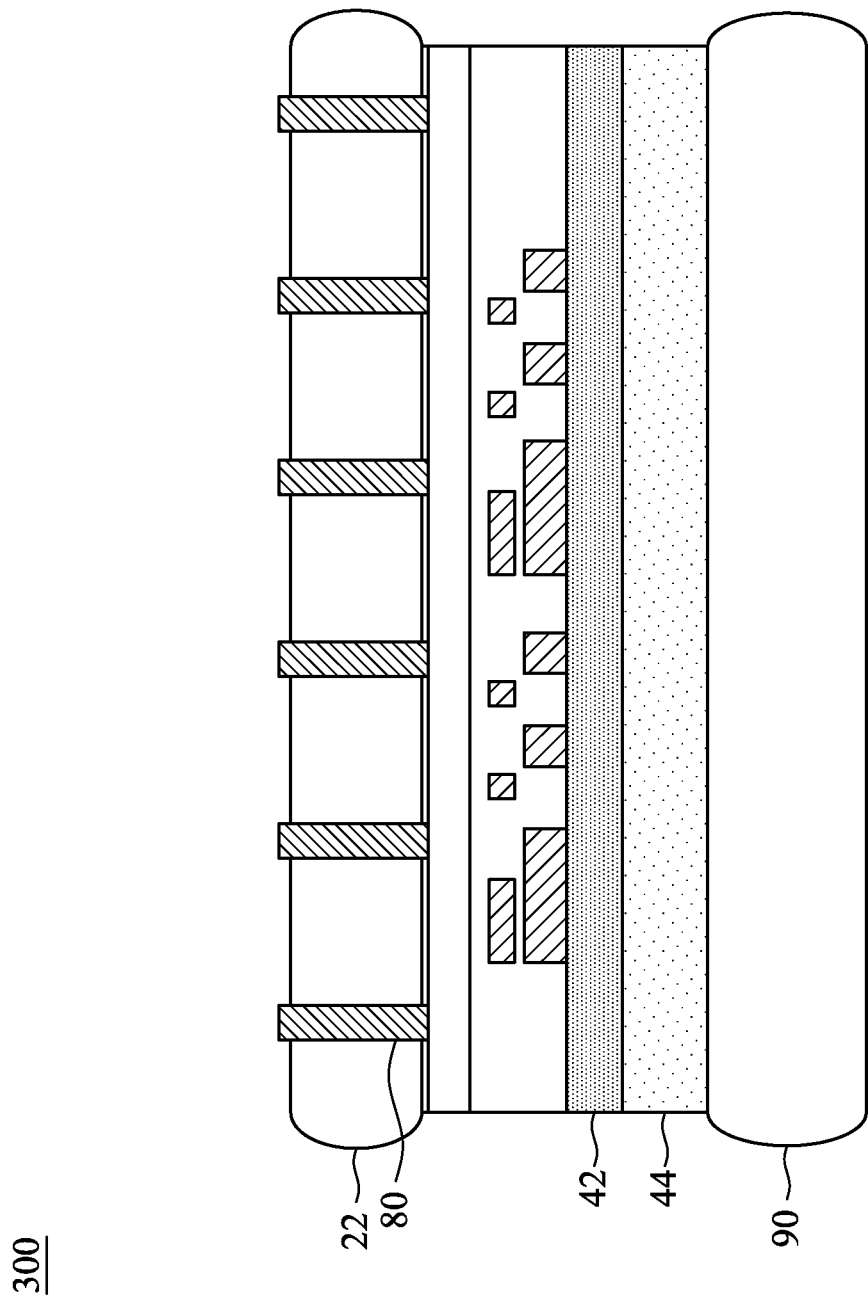

In FIG. 16, after the intermediate structure has been flipped, the substrate 22 is thinned to expose the conductive vias 80. Exposure of the conductive vias 80 may be accomplished by a thinning process, such as a grinding process, CMP, an etch-back, combinations thereof, or the like. In the illustrated embodiment, a recessing process is performed to recess the back-side surface the substrate 22 such that the conductive vias 80 level with the back-side surface of the substrate 22. The recessing process may be, e.g., a suitable etch-back process, CMP, or the like. In some embodiments, the thinning process for exposing the conductive vias 80 includes a CMP, and the conductive vias 80 protrude from the back-side surface of the substrate 22. In some embodiments not specifically illustrated, the back-side surface of the substrate 22 may have a dishing or concave curvature that occurs during the CMP.

Figure 17:
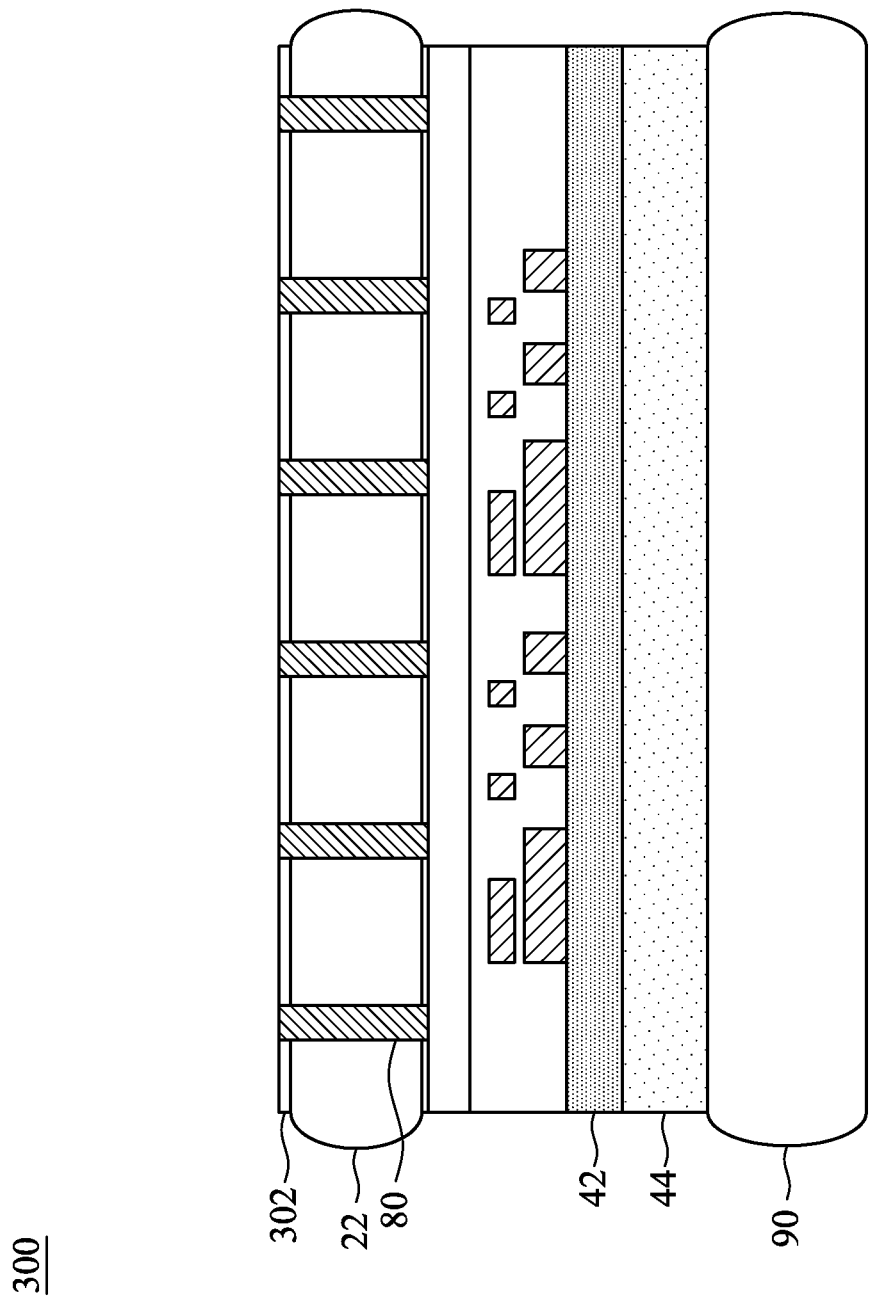

In FIG. 17, optionally, an insulating layer 302 may be formed on the back-side surface the substrate 22 and surrounding the protruding portions of the conductive vias 80. In some embodiments, the insulating layer 302 is formed from a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. Initially, the insulating layer 302 may bury the conductive vias 80. After deposition, a removal process can be applied to the various layers to remove excess materials over the conductive vias 80. The removal process may be a planarization process such as a CMP, an etch-back, combinations thereof, or the like. After planarization, the exposed surfaces of the conductive vias 80 and the insulating layer 302 are coplanar (within process variations). In another embodiment, the insulating layer 302 is omitted, and the exposed surfaces of the substrate 22 and the conductive vias 80 are coplanar (within process variations).

Although not specifically illustrated, in some embodiments, after thinning the substrate 22, an interconnect structure may be formed over the back-side surface of the substrate 22. The interconnect structure would be electrically connected to the conductive vias 80 and may be formed using similar processes and materials as described above in connection with the back-side interconnect structure 120. Subsequent process steps as described below may then be performed over the interconnect structure.

Figure 18:
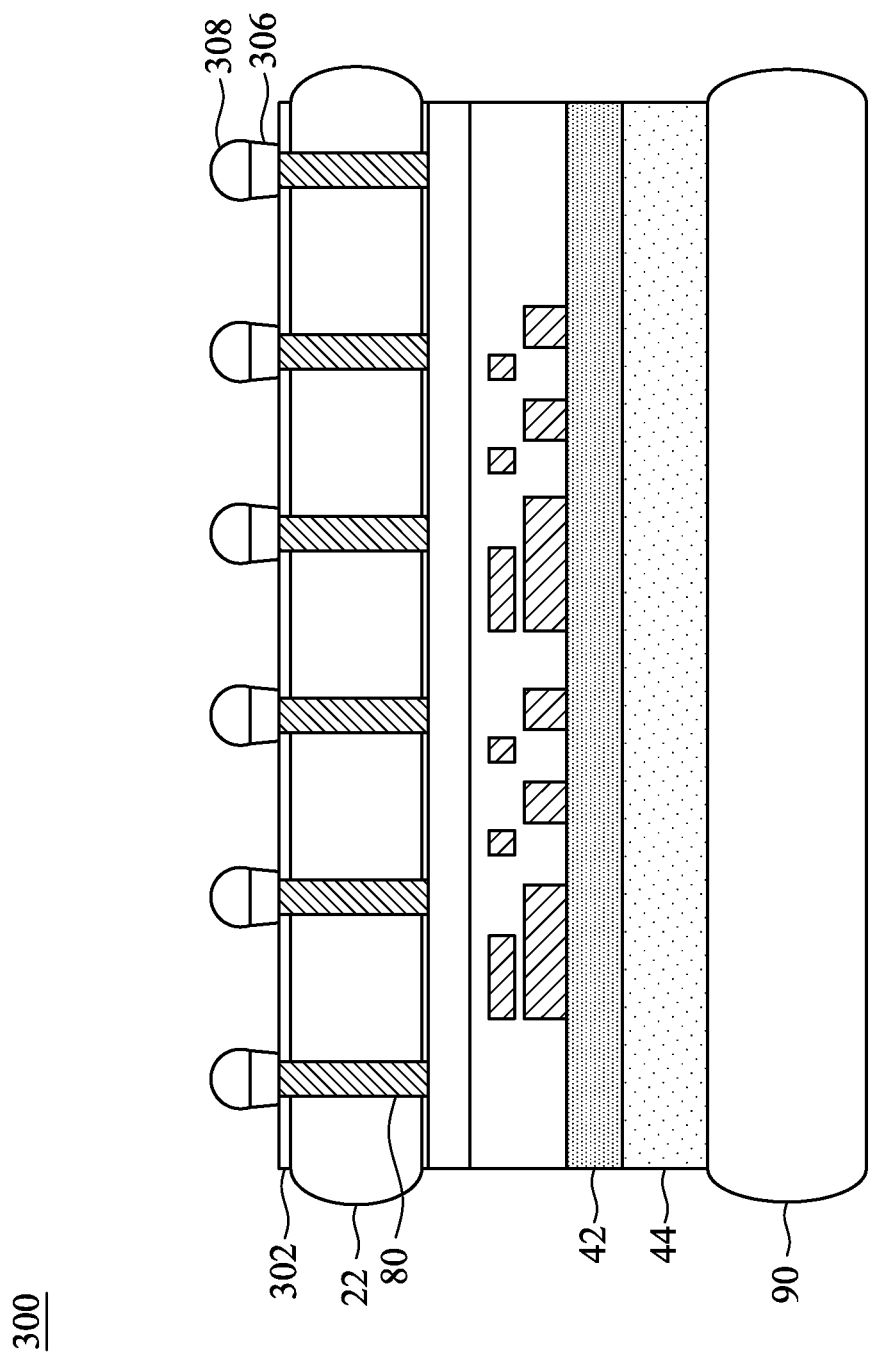

In FIG. 18, under bump metallurgies (UBMs) 306 are formed on the exposed surfaces of the conductive vias 80 and the insulating layer 302 (or the substrate 22 when the insulating layer 302 is omitted). As an example to form the UBMs 306, a seed layer (not illustrated) is formed over the exposed surfaces of the conductive vias 80 and the insulating layer 302. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 306. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 306.

Further, conductive connectors 308 are formed on the UBMs 306. The conductive connectors 308 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 308 may include a conductive material such as solder, copper, aluminum, gold, nickel, silver, palladium, tin, the like, or a combination thereof. In some embodiments, the conductive connectors 308 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 308 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Although not specifically illustrated, in some embodiments, the integrated circuit package 300 may be an intermediate structure to undergo further processing. For example, a singulation process may be performed by cutting along scribe line regions, e.g., between the package regions of the carrier wafer 90 to form a plurality of integrated circuit packages 300. The singulation process may include sawing, dicing, or the like. For example, the singulation process can include sawing the insulating layer 302, the substrate 22, the device layer 26, the front-side interconnect structure 30, the buffer layer 42, the first bonding layer 44, the second bonding layer 46, and the carrier wafer 90. The singulated integrated circuit packages 300 may then be attached and utilized with other packages.

Advantages may be achieved. The yield and reliability of various integrated circuit packages improves from preventing or reducing damage to conductive features from high power or high energy plasma processes. Plasma induced damage to conductive features can result in shorts or unreliability in the functionality of the integrated circuit composed of those conductive features. For example, a high power plasma process may be used to deposit a dielectric material that is capable of forming a robust bond with another dielectric material disposed over a carrier wafer or an integrated circuit. A buffer layer is deposited over the conductive features before performing the high power plasma process to form the dielectric material. During the subsequent high power plasma process, the buffer layer absorbs plasma and prevents it from reaching and damaging the underlying conductive features.

In an embodiment, a method includes performing a first plasma deposition to form a buffer layer over a first side of a first integrated circuit device, the first integrated circuit device comprising a first substrate and a first interconnect structure; performing a second plasma deposition to form a first bonding layer over the buffer layer, wherein a plasma power applied during the second plasma deposition is greater than a plasma power applied during the first plasma deposition; planarizing the first bonding layer; forming a second bonding layer over a second substrate; pressing the second bonding layer onto the first bonding layer; and removing the first substrate. In another embodiment, the plasma power applied during the first plasma deposition is in a range of about _100_ Watts to about 2000 Watts. In another embodiment, the buffer layer prevents plasma of the first plasma deposition from reaching the first interconnect structure during the first plasma deposition. In another embodiment, the method further includes, after removing the first substrate, forming a second interconnect structure over a second side of the first integrated circuit device. In another embodiment, a device layer interposes the first interconnect structure and the second interconnect structure. In another embodiment, the method further includes forming conductive connectors over the second interconnect structure. In another embodiment, the buffer layer comprises undoped silicate glass. In another embodiment, the first bonding layer comprises a high density plasma silicon oxide.

In an embodiment, a method includes forming a device layer over a first substrate; forming a first interconnect structure over the first substrate; performing a low power plasma deposition to form a first dielectric layer over the first interconnect structure; performing a high power plasma deposition to form a second dielectric layer over the first dielectric layer, the performing the high power plasma deposition comprising a plasma penetrating a portion of the first dielectric layer; and attaching a second substrate to the second dielectric layer, the second substrate comprising a third dielectric layer disposed over a semiconductor substrate, and attaching the second substrate to the second dielectric layer comprises physically contacting the second dielectric layer to the third dielectric layer. In another embodiment, a first conductive feature extends through an entirety of the second dielectric layer, wherein the second substrate further comprises a second conductive feature extending through an entirety of the third dielectric layer, and wherein attaching the second substrate comprises directly bonding the first conductive feature to the second conductive feature. In another embodiment, a first plasma power applied during the low power plasma deposition is in a range of between about 100 Watts and about 2000 Watts. In another embodiment, a second plasma power applied during the high power plasma deposition is in a range of between about 1000 Watts and about 10000 Watts. In another embodiment, conductive vias extend through at least a first portion of the first substrate, and further includes after attaching the second substrate to the second dielectric layer, removing at least a second portion of the first substrate; and after removing at least the portion of the first substrate, forming a second interconnect structure over the device layer, wherein the device layer is interposed between the first interconnect structure and the second interconnect structure. In another embodiment, the first dielectric layer is formed with a first thickness of greater than 600 nm. In another embodiment, the second dielectric layer is formed with a second thickness of greater than 1400 nm, and further comprising planarizing the second dielectric layer to a third thickness of greater than 800 nm.

In an embodiment, a device includes a first dielectric layer disposed over a carrier; a second dielectric layer disposed over and having a bonded interface with the first dielectric layer, the second dielectric layer comprising silicon oxide, the second dielectric layer comprising a different composition than the first dielectric layer; a third dielectric layer disposed over and physically contacting the second dielectric layer, the third dielectric layer comprising silicate glass, the third dielectric layer having a thickness of greater than 600 nm; a first interconnect structure disposed over the third dielectric layer; and a conductive connector disposed over the first interconnect structure. In another embodiment, the device further includes a device layer disposed over the first interconnect structure; and a second interconnect structure disposed over the device layer. In another embodiment, the third dielectric layer comprises a lesser density than that of the second dielectric layer. In another embodiment, the device further includes a substrate interposed between the first interconnect structure and the conductive connector, the substrate comprising a semiconductor material. In another embodiment, the device further includes a conductive via extending through the substrate, the conductive via electrically connecting the first interconnect structure to the conductive connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first plasma deposition to form a buffer layer over a first side of a first integrated circuit device, the first integrated circuit device comprising a first substrate and a first interconnect structure;
performing a second plasma deposition to form a first bonding layer over the buffer layer, wherein a plasma power applied during the second plasma deposition is greater than a plasma power applied during the first plasma deposition;
planarizing the first bonding layer;
forming a second bonding layer over a second substrate;
pressing the second bonding layer onto the first bonding layer; and
removing the first substrate.

2. The method of claim 1, wherein the plasma power applied during the first plasma deposition is in a range of about 100 Watts to about 2000 Watts.

3. The method of claim 1, wherein the buffer layer prevents plasma of the first plasma deposition from reaching the first interconnect structure during the first plasma deposition.

4. The method of claim 1 further comprising, after removing the first substrate, forming a second interconnect structure over a second side of the first integrated circuit device.

5. The method of claim 4, wherein a device layer interposes the first interconnect structure and the second interconnect structure.

6. The method of claim 5 further comprises forming conductive connectors over the second interconnect structure.

7. The method of claim 1, wherein the buffer layer comprises undoped silicate glass.

8. The method of claim 1, wherein the first bonding layer comprises a high density plasma silicon oxide.

9. A method comprising:
forming a device layer over a first substrate;
forming a first interconnect structure over the first substrate;
performing a low power plasma deposition to form a first dielectric layer over the first interconnect structure;
performing a high power plasma deposition to form a second dielectric layer over the first dielectric layer, the performing the high power plasma deposition comprising a plasma penetrating a portion of the first dielectric layer; and
attaching a second substrate to the second dielectric layer, the second substrate comprising a third dielectric layer disposed over a semiconductor substrate, and attaching the second substrate to the second dielectric layer comprises physically contacting the second dielectric layer to the third dielectric layer.

10. The method of claim 9, wherein a first conductive feature extends through an entirety of the second dielectric layer, wherein the second substrate further comprises a second conductive feature extending through an entirety of the third dielectric layer, and wherein attaching the second substrate comprises directly bonding the first conductive feature to the second conductive feature.

11. The method of claim 9, wherein a first plasma power applied during the low power plasma deposition is in a range of between about 100 Watts and about 2000 Watts.

12. The method of claim 11, wherein a second plasma power applied during the high power plasma deposition is in a range of between about woo Watts and about 10000 Watts.

13. The method of claim 9, wherein conductive vias extend through at least a first portion of the first substrate, and further comprising:
after attaching the second substrate to the second dielectric layer, removing at least a second portion of the first substrate; and
after removing at least the portion of the first substrate, forming a second interconnect structure over the device layer, wherein the device layer is interposed between the first interconnect structure and the second interconnect structure.

14. The method of claim 9, wherein the first dielectric layer is formed with a first thickness of greater than 600 nm.

15. The method of claim 14, wherein the second dielectric layer is formed with a second thickness of greater than 1400 nm, and further comprising planarizing the second dielectric layer to a third thickness of greater than 800 nm.

16. A method comprising:
forming a first semiconductor device, the first semiconductor device comprising:

a semiconductor substrate;
an active device along a first side of the semiconductor substrate; and
an interconnect structure over the first side of the semiconductor substrate and electrically connected to the active device;
performing a first plasma process to deposit a buffer layer over the interconnect structure, the first plasma process utilizing a first power;
performing a second plasma process to deposit a first bonding layer over the buffer layer, the second plasma process utilizing a second power, the second power being greater than the first power;
attaching a substrate to the first bonding layer, the attaching the substrate comprising:
depositing a second bonding layer over the substrate; and
directly bonding the second bonding layer to the first bonding layer;
removing at least a portion of the semiconductor substrate; and
forming a first conductive feature along a second side of the semiconductor substrate.

17. The method of claim 16, wherein the buffer layer has a greater thickness than the first bonding layer.

18. The method of claim 16, wherein the first conductive feature is electrically connected to the active device.

19. The method of claim 16, further comprising:
etching an opening through the first bonding layer and the buffer layer to expose the interconnect structure; and
forming a second conductive feature in the opening, the second conductive feature being electrically connected to the interconnect structure.

20. The method of claim 19, further comprising a third conductive feature embedded in the second bonding layer, wherein the substrate comprises an integrated circuit die, and wherein attaching the substrate to the first bonding layer further comprises directly bonding the third conductive feature to the second conductive feature.

* * * * *

UNITED STATES PATENT AND TRADEMARK OFFICE
CERTIFICATE OF CORRECTION

PATENT NO. : 11,908,829 B2  
APPLICATION NO. : 17/350856  
DATED : February 20, 2024  
INVENTOR(S) : Yao-Te Huang et al.

Page 1 of 1

It is certified that error appears in the above-identified patent and that said Letters Patent is hereby corrected as shown below:

In the Claims

Claim 12, Column 16, Line 47; delete "woo" and insert --1000--.

Signed and Sealed this  
Sixteenth Day of April, 2024

Katherine Kelly Vidal  
*Director of the United States Patent and Trademark Office*